(12) United States Patent
Ebrom et al.

(10) Patent No.: US 11,792,935 B2
(45) Date of Patent: Oct. 17, 2023

(54) HUMAN-MACHINE INTERFACE ASSEMBLIES

(71) Applicant: WHIRLPOOL CORPORATION, Benton Harbor, MI (US)

(72) Inventors: Matthew P. Ebrom, Holland, MI (US); Neomar Giacomini, St. Joseph, MI (US); Mark E. Glotzbach, Granger, IN (US); Brian N. Radford, Stevensville, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 0 days.

(21) Appl. No.: 17/506,824

(22) Filed: Oct. 21, 2021

(65) Prior Publication Data

US 2022/0046799 A1 Feb. 10, 2022

Related U.S. Application Data

(60) Division of application No. 16/506,515, filed on Jul. 9, 2019, now Pat. No. 11,172,575, which is a continuation of application No. 14/938,980, filed on Nov. 12, 2015, now Pat. No. 10,375,829.

(51) Int. Cl.
| | |
|---|---|
| *H05K 1/18* | (2006.01) |
| *G06F 1/16* | (2006.01) |
| *G06F 3/041* | (2006.01) |
| *H05K 3/32* | (2006.01) |
| *H05K 1/14* | (2006.01) |

(52) U.S. Cl.
CPC ........... *H05K 1/181* (2013.01); *G06F 1/1637* (2013.01); *G06F 3/041* (2013.01); *H05K 1/144* (2013.01); *H05K 3/325* (2013.01); *G06F 2203/04103* (2013.01); *H05K 2201/0367* (2013.01); *H05K 2201/041* (2013.01); *H05K 2201/10106* (2013.01); *H05K 2201/10598* (2013.01)

(58) Field of Classification Search
CPC ...... H05K 1/181; H05K 3/325; G06F 1/1637; G06F 3/041
See application file for complete search history.

(56) References Cited

U.S. PATENT DOCUMENTS

| | | | |
|---|---|---|---|
| 4,302,647 A | 11/1981 | Kandler et al. | |
| 4,771,139 A | 9/1988 | Desmet | |
| 4,859,188 A * | 8/1989 | Neumann | H01R 12/523 439/83 |
| 5,132,879 A * | 7/1992 | Chang | H01L 23/5385 439/47 |
| 5,181,030 A | 1/1993 | Itaya et al. | |
| 5,354,205 A * | 10/1994 | Feigenbaum | G01R 1/073 29/831 |

(Continued)

OTHER PUBLICATIONS

European Search Report for European Application 16198299.6, dated Mar. 22, 2017, 8 Pages.

*Primary Examiner* — Kyung S Lee
(74) *Attorney, Agent, or Firm* — McGarry Bair PC

(57) ABSTRACT

Example human-machine interface (HMI) assemblies are disclosed. One example HMI assembly includes a fascia, a touch film having a first raised contact, a PCB having a second raised contact, and a piercing member passing through the first and second contacts to electrically couple the first and second contacts.

20 Claims, 10 Drawing Sheets

(56) References Cited

U.S. PATENT DOCUMENTS

| | | | | |
|---|---|---|---|---|
| 5,761,050 A | * | 6/1998 | Archer | H01R 12/523 |
| | | | | 361/791 |
| 6,664,489 B2 | | 12/2003 | Kleinhans et al. | |
| 6,831,236 B2 | * | 12/2004 | Higuchi | H05K 3/4617 |
| | | | | 174/262 |
| 6,863,542 B2 | * | 3/2005 | Miyashita | H01R 12/7082 |
| | | | | 439/74 |
| 6,881,077 B2 | | 4/2005 | Throum | |
| 7,086,870 B1 | * | 8/2006 | Sutcliffe | H01R 4/028 |
| | | | | 439/75 |
| 7,355,861 B2 | | 4/2008 | Durney et al. | |
| 7,446,274 B2 | | 11/2008 | Choi et al. | |
| 7,508,682 B2 | | 3/2009 | Badarinarayan et al. | |
| 7,705,257 B2 | | 4/2010 | Arione et al. | |
| 7,915,553 B2 | | 3/2011 | Arione et al. | |
| 7,923,654 B2 | | 4/2011 | Zeijlon et al. | |
| 8,462,022 B2 | | 6/2013 | Roth | |
| 8,614,689 B2 | * | 12/2013 | Nishikawa | H05K 3/368 |
| | | | | 178/18.05 |
| 8,638,306 B2 | | 1/2014 | Ferenez et al. | |
| 8,648,832 B2 | | 2/2014 | Maloof et al. | |
| 9,219,325 B2 | * | 12/2015 | Endo | H01R 13/46 |
| 9,379,468 B2 | * | 6/2016 | Zieman | H01R 12/91 |
| 2008/0053700 A1 | | 3/2008 | O'Connor et al. | |
| 2008/0143559 A1 | | 6/2008 | Dietz et al. | |
| 2008/0257706 A1 | | 10/2008 | Haag | |
| 2010/0079153 A1 | | 4/2010 | Maloof et al. | |
| 2014/0301106 A1 | | 10/2014 | Schuh | |
| 2015/0160691 A1 | | 6/2015 | Muench et al. | |
| 2016/0181028 A1 | | 6/2016 | Ebrom et al. | |

* cited by examiner

HUMAN-MACHINE INTERFACE ASSEMBLIES

CROSS-REFERENCE TO RELATED APPLICATION(S)

This application is a divisional of U.S. patent application Ser. No. 16/506,515, filed Jul. 9, 2019, now U.S. Pat. No. 11,172,575, issued Nov. 9, 2021, which is a continuation of U.S. patent application Ser. No. 14/938,980, filed Nov. 12, 2015, now U.S. Pat. No. 10,375,829, issued Aug. 6, 2019, both of which are hereby incorporated herein by reference in their entirety.

FIELD OF THE DISCLOSURE

This disclosure relates generally to interfaces and, more particularly, to human-machine interface assemblies.

BACKGROUND

Many devices have user interfaces that allow a person to operate and monitor the device. Example user interfaces include elements such as buttons, knobs, switches, touch areas, decorative features, illuminated features, etc.

BRIEF SUMMARY

Example human-machine interface (HMI) assemblies are disclosed. One example HMI assembly includes a fascia, a touch film having a first raised contact, a PCB having a second raised contact, and a piercing member passing through the first and second contacts to electrically couple the first and second contacts.

DETAILED DESCRIPTION

Figure 1:
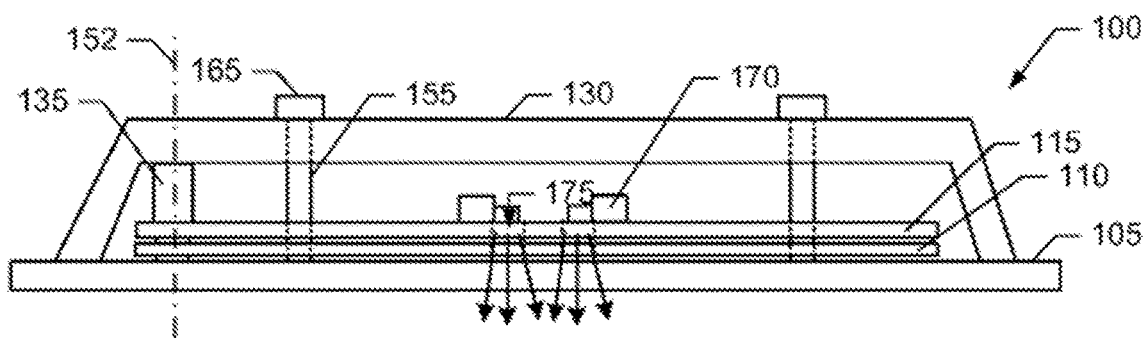
FIG. 1 is a side view of an example human-machine interface (HMI) assembly constructed in accordance with the teachings of this disclosure.

Current human-machine interface (HMI) assemblies use connectors to couple touch films and printed circuit boards (PCBs). For example, a touch film may have an extending flat cable that is used to form a connection. Such solutions may be costly, complex, difficult to assemble and/or unreliable. To overcome at least these problems, disclosed example HMI assemblies directly connect a PCB and touch film via opposing contacts that are pressed or biased together by a mechanical force applied by a backer. Various example backer arrangements constructed to apply this force are disclosed herein. In some examples, heatstakes may be eliminated. In other examples, lit touch buttons outside the boundary of a PCB may be constructed.

Additionally and/or alternatively, the use of heatstakes to construct HMI assemblies can limit where light and/or touch elements can be placed on a fascia. The number and placement of heatstakes may be determined for mechanical reasons. Thus, a heatstake may need to be placed at a location where it is desirable to place lighted and/or touch elements for functional and/or aesthetic reasons. To overcome at least these problems, example heatstakes that can act as a light pipe or light guide are disclosed. In some examples, light can be emitted into a heatstake at a PCB and then exit at an end of the heatstake at the fascia.

Combinations of any of these examples are contemplated and may be constructed to concurrently realize one or more of the benefits discussed above. The example HMI assemblies disclosed herein may be used as part of any number and/or type(s) of apparatus or devices having a user interface. Example apparatuses and devices include, but are not limited to, a domestic appliance such as a refrigerator, a stove, a range, an oven, a microwave, a dishwasher, a washing machine, a dryer, a freezer, an ice maker, a wine cooler, a beer cooler, a clothes refresher, etc., and/or in any other apparatus, device, etc. having an HMI.

As used herein, terms such as up, down, top, bottom, side, end, front, back, etc. are used with reference to a currently considered or illustrated orientation. If it is considered with respect to another orientation, it should be understood that such terms must be correspondingly modified.

Reference will now be made in detail to non-limiting examples of this disclosure, examples of which are illustrated in the accompanying drawings. The examples are described below by referring to the drawings, wherein like reference numerals refer to like elements. When like reference numerals are shown, corresponding description(s) are not repeated and the interested reader is referred to the previously discussed figure(s) for a description of the like element(s). While the examples disclosed herein are, for ease of illustration, flat HMI assemblies, it should be understood that HMI assemblies according to this disclosure may be curved. Moreover, while example arrangements of decorative, touch, light, etc. elements are shown and discussed herein, other arrangements and/or different numbers of elements may be realized. Furthermore, the example HMI assemblies shown in the attached drawings are not drawn to scale, with specific shapes, or with specific relative dimensions as they are not important to this disclosure and may render the drawings more difficult to comprehend. Specific elements may have been intentionally exaggerated for discussion purposes. Instead, the drawings have been drawn for clarity and comprehension.

Figure 2:
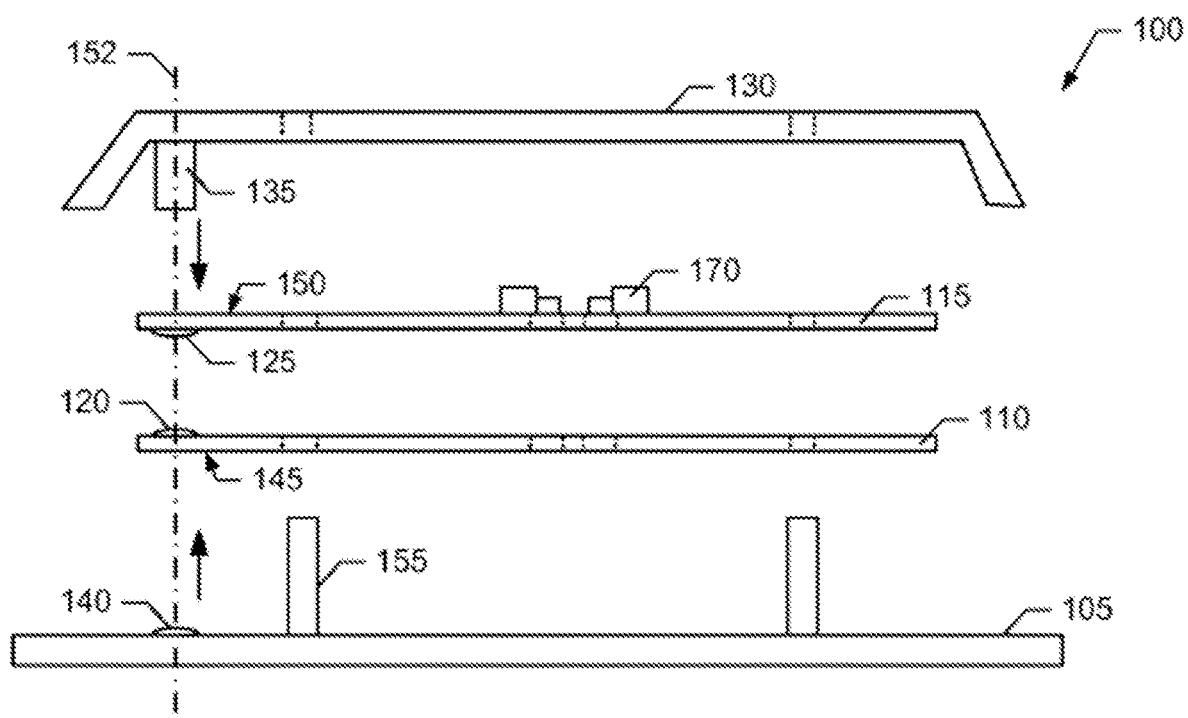
FIG. 2 is an exploded side view of the example HMI assembly of FIG. 1.

FIG. 1 is a side view of an example HMI assembly 100 constructed in accordance with the teachings of this disclosure. FIG. 2 is an exploded side view of the example HMI assembly 100 of FIG. 1. The example HMI assembly 100 includes a fascia 105 formed of a decorative material, such as black plastic, painted plastic, etc. and may include, for example, an in-molded label, an in-molded decoration, a polycarbonate layer, a glass layer, a lens, etc. The bottom of the fascia 105 (in the orientation of FIGS. 1 and 2) is the portion of the HMI assembly 100 intended to be seen by and used by a user.

The example HMI assembly 100 includes a touch film 110 and a PCB 115. As best seen in FIG. 2, to electrically couple the touch film 110 and the PCB 115, the example touch film 110 has an electrical contact 120 facing the PCB 115, and the example PCB 115 has an electrical contact 125 facing the electrical contact 120 on the touch film 110. To electrically couple the contacts 120 and 125, the HMI assembly 100 includes a backer 130 having a extending or extension member 135, and optionally a feature 140 defined on the fascia 105. When assembled as shown in FIG. 1, the feature 140 or the fascia 105 applies an upward force (in the orientation of FIGS. 1 and 2) to the bottom 145 of the touch film 110 at the contact 120; and the extending or extension member 135 applies a downward force to the top 150 of the PCB 110 at the contact 125. That is, the feature 140 and member 135 are configured or disposed to press the first contact 120 against the second contact 125. These upward and downward forces press or bias the contacts 120 and 125 into electrical contact, and substantially prevent the contacts 120 and 125 from losing electrical contact. As shown, the extending or extension member 135, the contact 125, the contact 120 and the feature 140 are linearly aligned along a line 152.

The example backer 130 is a member formed to hold the touch film 110 and the PCB 115 to each other and to the fascia 105. To attach the backer 130 to the fascia 105, the example fascia 105 includes any number of heatstakes, one of which is designated at reference number 155. As the HMI assembly 100 is assembled, the heatstakes 155 pass through holes (one of which is designated at reference numeral 160) defined through the backer 130. While not designated in FIG. 2, the heatstakes 155 also pass through openings defined through the fascia 110 and the PCB 115. When the backer 130 is pressed against the fascia 105, the portion of the heatstakes 155 extending through the holes 160 are partially melted to form heads (one of which is designated are reference numeral 165) that hold the backer 130 firmly in mechanically contact with the fascia 105. The formation of the heads 165 creates an elastic force between the fascia 105 and the backer 130, causing the feature 140 and the extending or extension member 135 to securely press the contacts 120 and 125 against each other. In addition to and/or alternatively to heatstakes 155, other elements such as snaps, screws, etc. could be used to attach the backer 130 to the fascia 105.

In some examples, the contacts 120 and 125 and the feature 140 are raised features that prevent other aspects of the touch film 110 or PCB 115 from impeding mechanical and electrical contact. Raised contacts may be, for example, formed of solder in the form of raised flat pads, bumps, domed pads, etc. Moreover, the contacts 120 and 125 may have complementary shapes (e.g., one having a concave shape while the other has a convex, etc.) such that one of the contacts 120, 125 has a portion, surface, etc. that mates with or fits into the other contact 120, 125 to assist in alignment. Further, one of the contacts 120 and 125 may be raised. While, only one pair of contacts 120 and 125 is shown in FIGS. 1 and 2, any number and/or type(s) of contacts may be realized by the HMI assembly 100.

Figure 28:
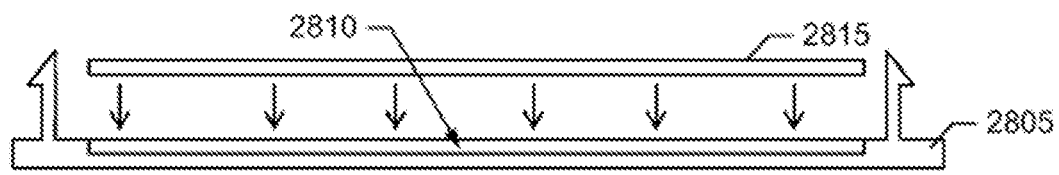
FIG. 28 is a side view of another example fascia having another example feature that may be used to align the example PCB and example backer of FIGS. 20-23.
Figure 29:
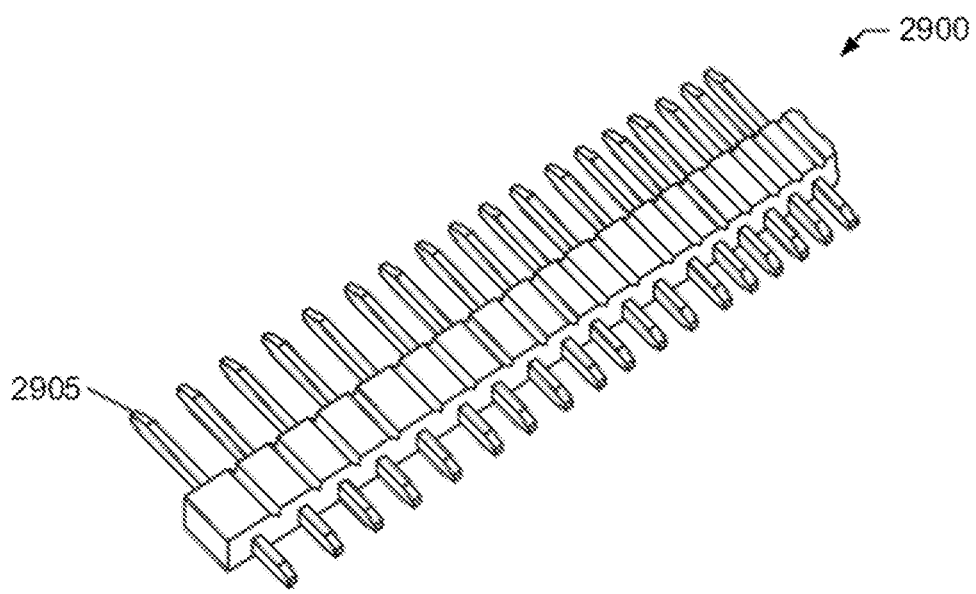
FIG. 29 is an isometric view of an example header.

Other example methods to align the contacts 120 and 125 use a metallic header or connector, such as the example header 2900 shown in FIG. 29, which would be soldered to the PCB 115. In some examples, a single-row header 2900 such as that shown in FIG. 29 rather than a multi-row header is used to reduce plastic molding tolerances. The piercing metal pins 2905 on the header 2900 provide an electrical connection or coupling between the raised contacts 120 and 125. The raised contacts 120 and 125 include small piercings or openings in their centers for the header pins 2905 to pass through and to form the electrical connection or coupling. Additionally, the header 2905 can mechanically mate with the fascia 105 to additionally or alternatively provide a higher retention force. In such an example, the piercing header pins 2905 effectively socket into the fascia 105. The mating piercings in the fascia 105 could be sized slightly smaller than the pin diameter to create the retention force. In some example, the use of a header could reduce or obviate the need for the backer 130 when it is not needed for lighting purposes, reducing cost. The header 2900 shown in FIG. 29 is a through-hole component that provides enhanced mechanical stability; however, a surface mount component could also be used to lower component and/or processing costs. Other similar mountable electronic components could be used in a similar fashion, including simple mechanical components like metal screws that are screwed through the raised contacts 120 and 125 and into threaded inserts in the fascia 105. These example methods of alignment may be used in addition to or alternatively to the examples discussed below in connection with FIGS. 22, 23, 25A-B, 26, 27 and 28.

As shown in the example of FIGS. 1 and 2, the PCB 115 has one or more light emitting diodes (LEDs) 170 that emit light though respective holes 175 defined through the PCB 115, the touch film 110 and, in some examples, at least partially through the fascia 105. In some examples, the holes 175 have a different radius for each of the PCB 115, the touch film 110 and the fascia 105. In some examples, the holes 175 are not defined through, or only part way through the fascia 105 when, for example, the fascia 105 is at least partially translucent or transparent. The holes 175 may have any shape, such as circular.

While not shown in FIG. 1 for clarity, light cups such as those discussed below in connection with FIG. 18 may be used to direct light from the LEDs 170 through the holes 175. However, light cups need not be used.

Figure 3:
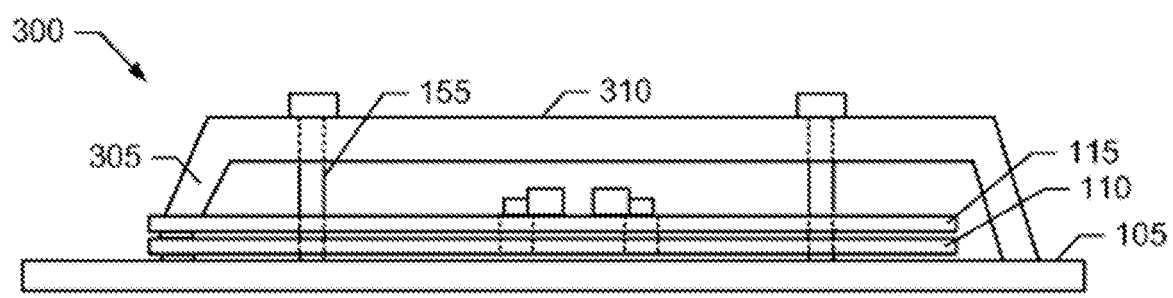
FIG. 3 is a side view of another example HMI assembly constructed in accordance with the teachings of this disclosure.

As shown in the example of FIG. 3, other portions 305 of a backer 310 may be used to apply a mechanical force to the PCB 115 to bias or press the contacts 120 and 125 against each other. In some examples, the members 135 and 305 are stiff and rely on the elasticity of the backers 130 and 310 to hold the members 135 and 305 against the PCB 115. As used herein, a stiff member or element refers to a member or element that is substantially not intended to deflect, deform or otherwise change its shape under normal operating conditions for the HMI assembly to which the stiff member or material belongs.

Figure 4:
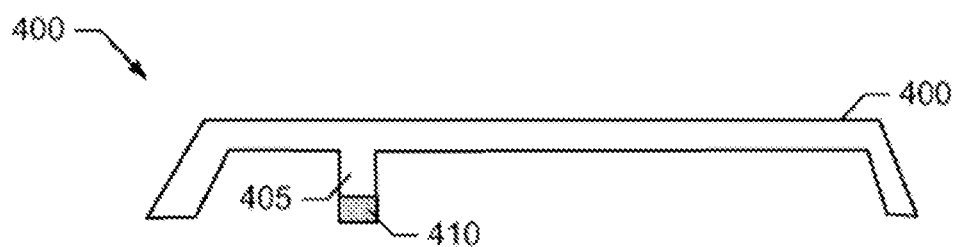
FIG. 4 is another example backer that may be used to construct the example HMI assembly of FIG. 1.

In some examples, such as that shown in FIG. 4, a backer 400 includes a stiff portion 405 and a compressible portion 410 such as a rubber, etc. tip or end. In some examples, the portion 410 is constructed to reduce rubbing or other undesired movements against the PCB 115 that may damage the PCB 115 during some uses. The compressible portion 410 may, for example, be co-injected or inset into the portion 405.

Figure 5:
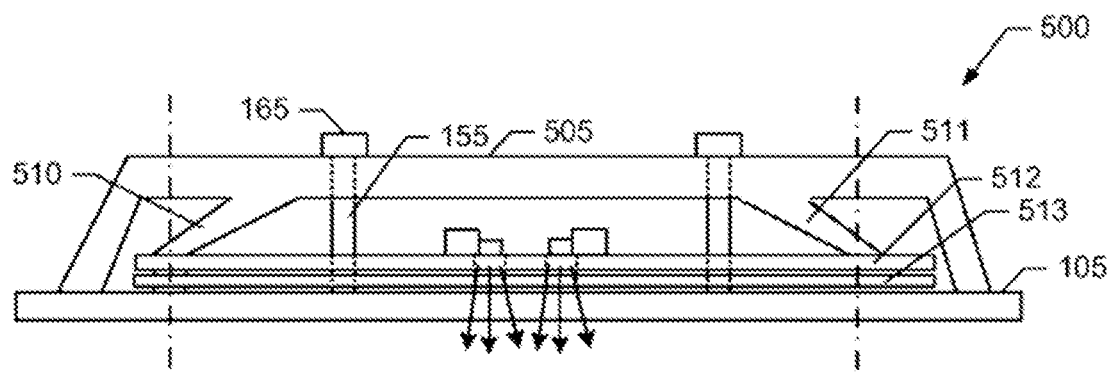
FIG. 5 is a side view of still another example HMI assembly constructed in accordance with the teachings of this disclosure.
Figure 6:
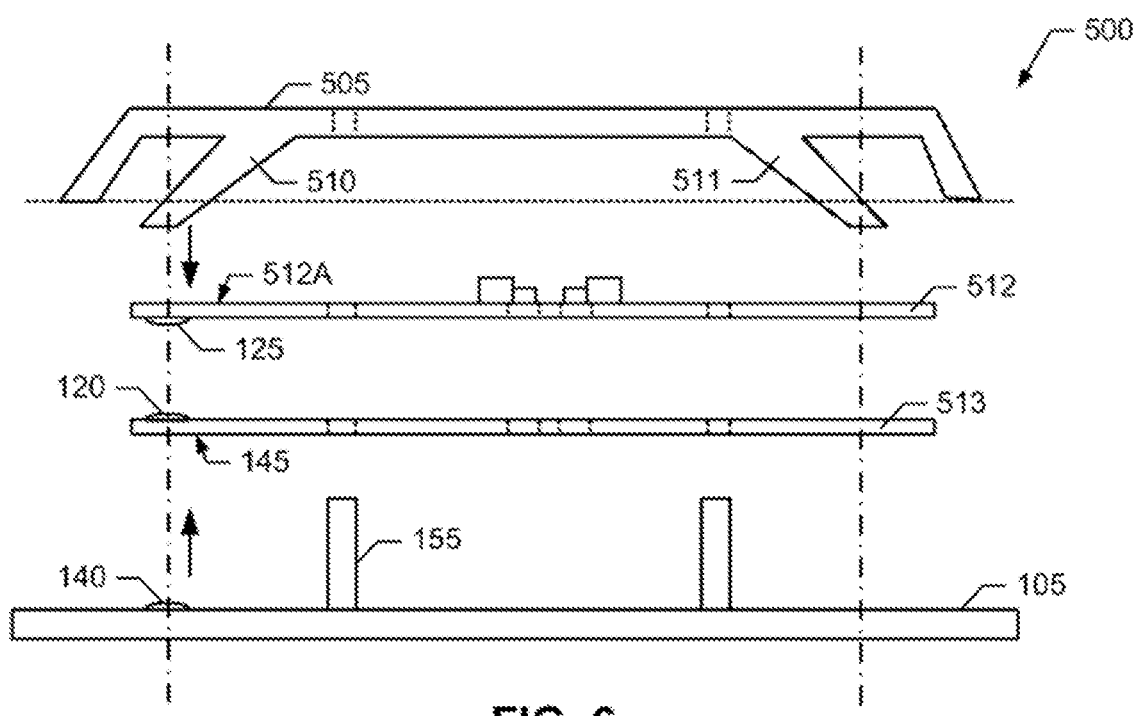
FIG. 6 is an exploded side view of the example HMI assembly of FIG. 5.
Figure 7:
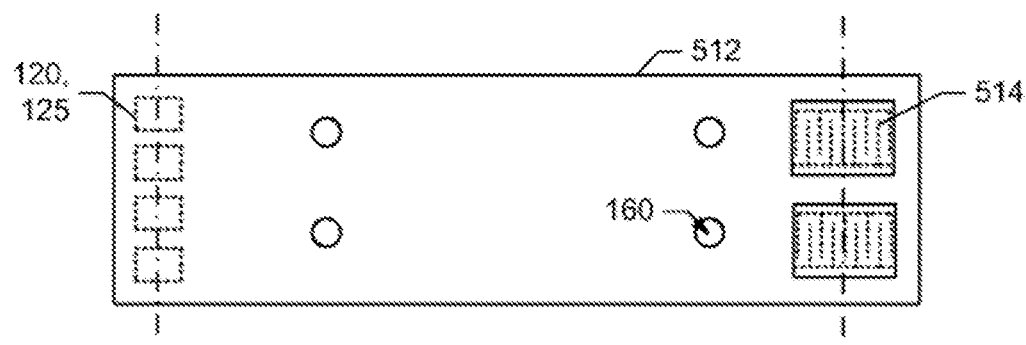
FIG. 7 is an example printed circuit board (PCB) that may be used to construct the example HMI assembly of FIG. 5.

FIG. 5 is a side view of an example HMI assembly 500 having a backer 505 with one or more flexible or elastic extending members, two of which are designated at reference numerals 510 and 511. FIG. 6 is an exploded side view of the example HMI assembly 500 of FIG. 5, and FIG. 7 is a top view of an example PCB 512 having a touch film 513 beneath. In FIGS. 5 and 6, the example flexible extending members 510 and 511 have an angled or finger shape. Like the extending or extension member 135, the example flexible extending members 510 and 511 are configured and/or disposed to apply a downward force to the top 512A of the PCB 512. As shown in FIG. 6, the flexible members 510 and 511 extend beyond the bottom of the backer 505 in their relaxed state. The flexible extending members 510 and 511 are flexed during the heatstaking of the backer 505 to the fascia 105 into their flexed position where they apply the downward force to the top 512A of the PCB 512. Other techniques and/or components may be used to attach the backer 505 to the fascia 105. The flexible members 510 and 511 apply, in some examples, a spring force against the PCB 512. Due to the resiliency of the flexible extending member 510, less pressure needs to be applied to the backer 505 during the heatstaking. As shown, the extending members 510 and 511 may be used to apply force to any number and/or type(s) of areas or components of the PCB 512 and the touch film 513. For example, force may be applied by the flexible member 510 to contacts 120 and 125, and by the flexible member 515 to touch cells 514 on the touch film 513. Because the extending members 510 and 511 are flexible, they can additionally compensate for aging of the fascia 105 and/or backer 505.

Figure 8:
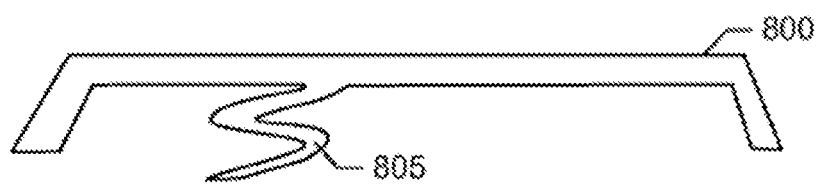
FIGS. 8 and 9 are alternative example backers that may be used to construct the example HMI assembly of FIGS. 5 and 6.

FIG. 8 is a side view of another example backer 800 having another example flexible member 805 having an S-shape.

Figure 9:
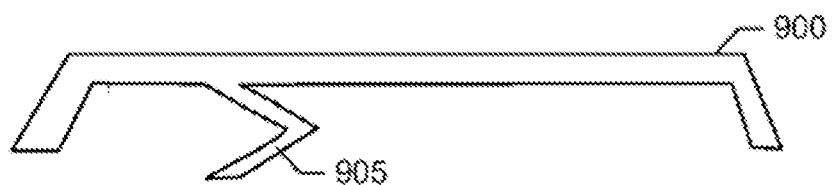

FIG. 9 is a side view of yet another example backer 900 having yet another example flexible member 905, having a Z-shape.

As shown in FIGS. 5, 6, 8 and 9, backers may be formed to have any shaped flexible member. Moreover, any combination of flexible member shapes may be used. Further, any number of flexible members may be present. Further still, any number and/or combination(s) of stiff and flexible members may be present. Even further, flexible and stiff members may be arranged in any pattern(s).

Figure 10:
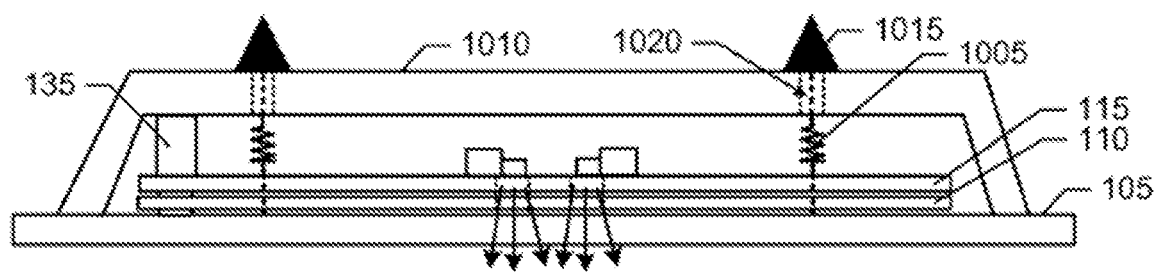
FIG. 10 is a side view of yet another example HMI assembly constructed in accordance with the teachings of this disclosure.

Turning to FIG. 10, spring members (one of which is designated at reference numeral 1005) are used to attach a backer 1010 to the fascia 105 instead of or in addition to heatstakes. The example spring member 1005 of FIG. 10 is attached at one end to the fascia 105. The spring member 1005 pass through the touch film 110 and PCB 115. A head 1015 of the spring member 1005 is deformable allowing the head 1015 to pass through an opening 1020 defined through the backer 1010. Having passed through the opening 1020, the head 1015 returns to its original shape, thus preventing the head 1015 from passing back through the opening 1020. Locked or engaged in place, the spring member 1005 is loaded and, thus, applies a downward pressure (in the orientation of FIG. 10) to hold the backer 1010 firmly in place against the fascia 105. Additionally or alternatively, the backer 1010 is deformable in at least one direction to allow a non-deformable head 1015 to pass through and become engaged with the backer 1010.

Figure 11:
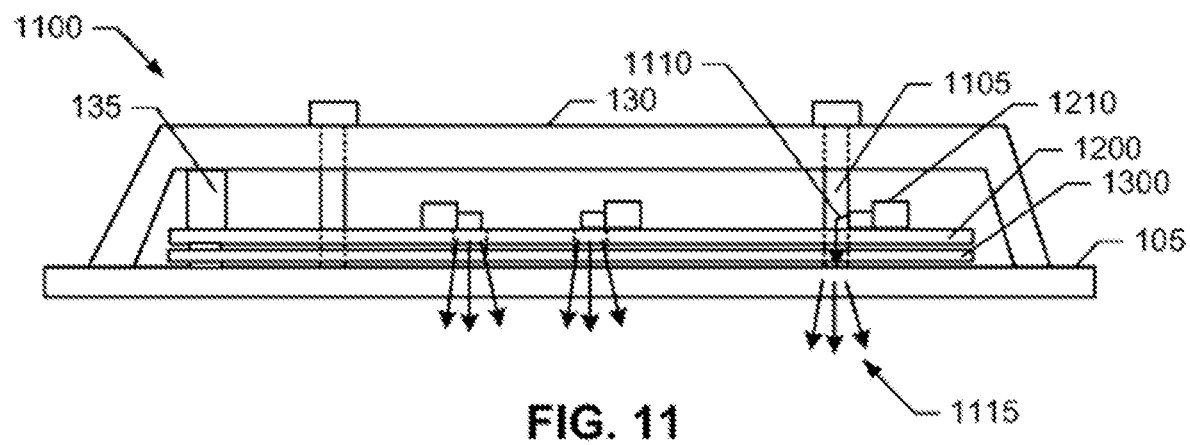
FIG. 11 is a side view of still another example HMI assembly constructed in accordance with the teachings of this disclosure.
Figure 12:
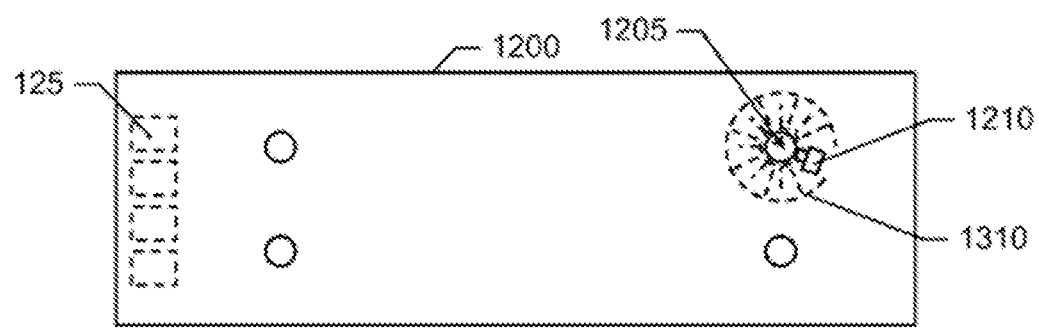
FIG. 12 is a top of an example PCB that may be used to construct the example HMI assembly of FIG. 11.
Figure 13:
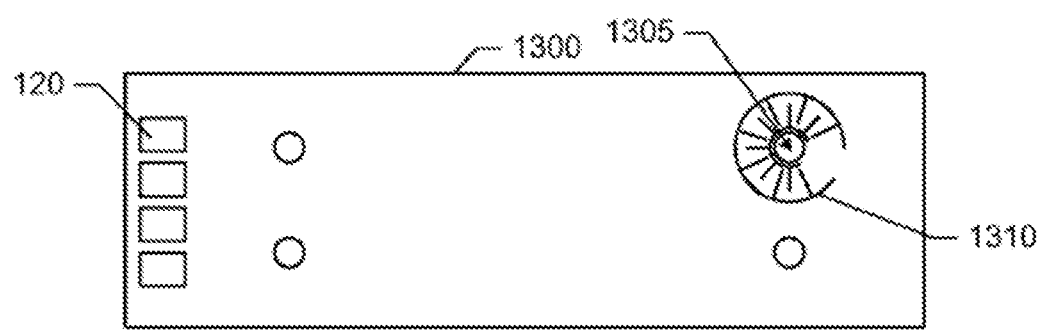
FIG. 13 is a top view of an example touch film that may be used to construct the example HMI assembly of FIG. 11.

FIG. 11 is a side view of still another example HMI assembly 1100 constructed in accordance with the teachings of this disclosure. FIG. 12 is a top view of an example PCB 1200 that may be used to construct the example HMI assembly 1100. FIG. 13 is a top view of an example touch film 1300 that may be used to construct the example HMI assembly 1100.

In the example of FIGS. 11-13, a heatstake 1105 attaches the fascia 105 to the backer 130. The heatstake 1105 passes through an opening 1205 defined through the PCB 1205 (see FIG. 12) and an opening 1305 defined through the touch film 1300 (see FIG. 13). In some examples, cross-sections of the heatstake 1105, opening 1205 and the opening 1305 correspond. The example heatstake 1105 is at least partially transparent or translucent, or otherwise capable of receiving, transporting, emitting, etc. light.

An example touch cell 1310 of the touch film 1300 surrounds the opening 1305. The opening 1205 of the PCB 1200 aligns with the touch cell 1310, as shown in FIG. 12, where the touch cell 1310 shown with dotted lines is depicted as being below the PCB 1200 at the opening 1205.

As shown in FIGS. 11 and 12, an LED 1210 on the PCB 1200 emits light 1110 into the side of the heatstake 1105 using any number of element(s), technique(s) and/or method(s). The light 1110 passes downward (in the orientation of FIG. 11) along the heatstake 1105 and is emitted as light 1115 out through the fascia 105. Because the heatstake 1105 passes through the touch cell 1310, the emitted light 1110 illuminates at least the center of the touch cell 1310 at the fascia 105. In some examples, a diffuser or other optical element may be implemented at the fascia 105 to improve the quality, evenness, color, etc. of the emitted light 1115. Thus, the light 1110 may differ from the light 1115. In some examples, the heatstake 1105 has a planar side along at least a portion of its length to improve light capture from the LED 1210. In other examples, the LED 1210 sits in front of a single-axis concave shape on a rounded wall portion on the heatstake 1105, such as a pipe wall cut in half shape.

Figure 14:
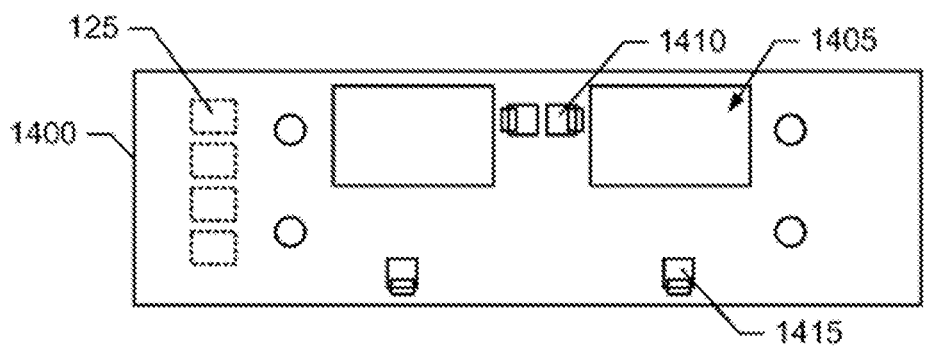
FIG. 14 is a top view of another example PCB.
Figure 15:
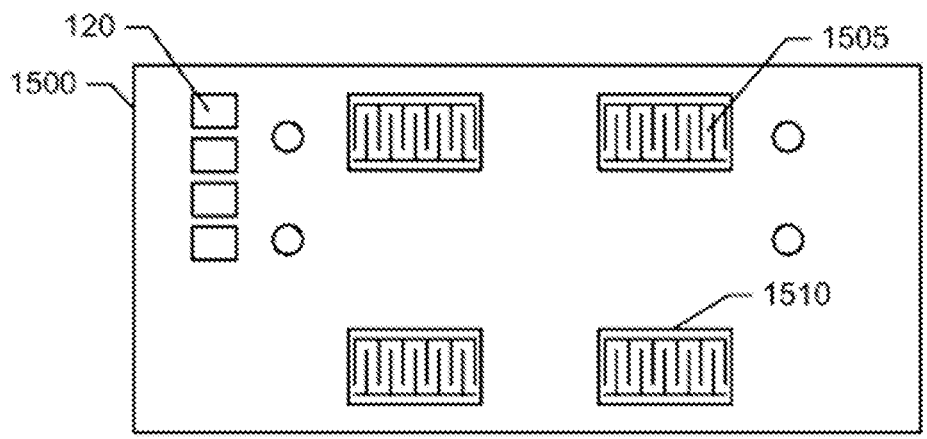
FIG. 15 is a top view of another example touch film.
Figure 16:
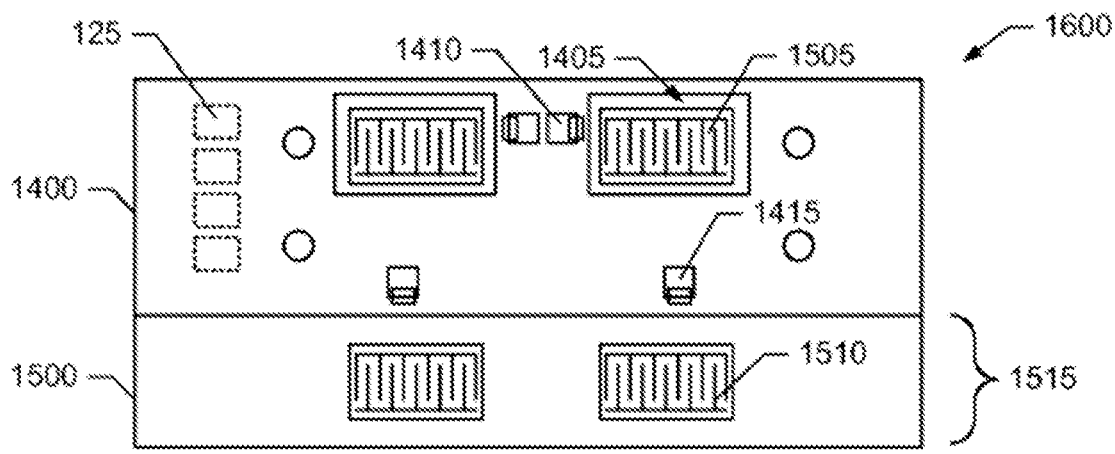
FIG. 16 is a top view of an assembly comprising the example PCB of FIG. 14 and the example touch film of FIG. 15.
Figure 17:
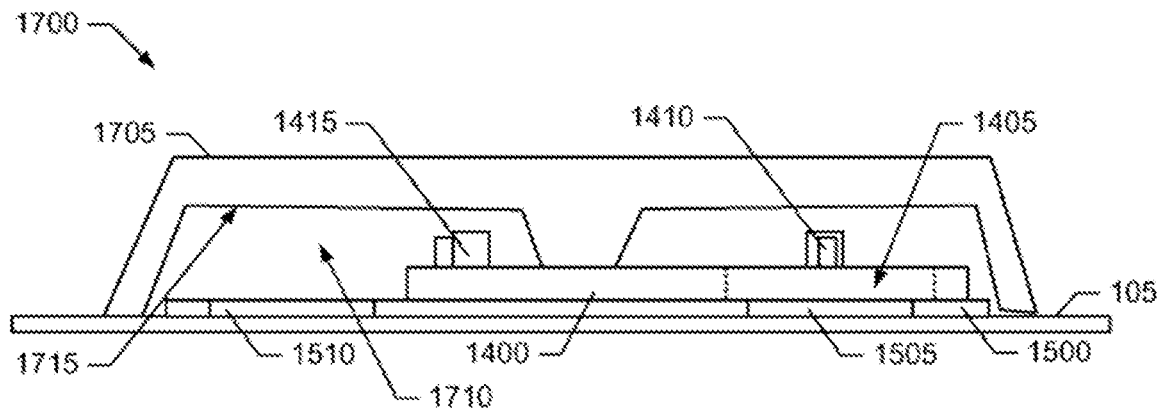
FIG. 17 is a side view of a further example HMI assembly constructed using the example assembly of FIG. 16.

FIG. 14 is a top view of an example PCB 1400. FIG. 15 is a top view of an example touch film 1500. FIG. 16 is top view of an example assembly 1600 constructed from the example PCB 1400 and example touch film 1500. FIG. 17 is a side view of an example HMI assembly 1700 constructed in accordance with the teachings of this disclosure using the example PCB 1400, the example touch film 1500, and the example assembly 1600.

As shown in FIGS. 14, the example PCB 1400 has openings defined therethrough (one of which is designated at reference numeral 1405) that allow light emitted by LEDs (one of which is designated at reference numeral 1410) to pass through the opening 1405. The example PCB 1400 has additional LEDS, such as an LED 1415 intended to illuminate portions of the example HMI assembly 1700 beyond the border or periphery of the PCB 1400.

The example touch film 1500 of FIG. 15 has touch cells corresponding to the openings 1405, one of which is designated at reference number 1505. The touch film 1500 has additional touch cells, such as a touch cell 1510 that, as shown in FIG. 15, are positioned outside the border or periphery of the PCB 1400. In some examples, the portion 1515 of the touch film 1500 that is beyond the PCB 1400 includes LEDs or other components and circuits, and/or a top portion of the touch film 1500 is exposed. In this way, the touch film 1500 may, at least partially, implement functionality normally done on a PCB. In some examples, the touch film 1500 outside the PCB 1400 is glued or otherwise adhered to the fascia 105, see FIG. 17.

The example assembly 1600 of FIG. 16 is constructed by positioning or placing the PCB 1400 in the orientation of FIG. 14 on top of the touch film 1500 in the orientation of FIG. 15. As shown, the openings 1405 in the PCB 1400 align with the touch cells 1505 on the touch film 1500 to allow light emitted by the LEDs 1410 to illuminate the touch cells 1505. The LEDs 1415 are positioned to illuminate the touch cell 1510, which is outside the border or periphery of the PCB 1500.

FIG. 17 is a side view of an example HMI assembly 1700 constructed in accordance with the teachings of this disclosure using the example assembly 1600 of FIG. 16. The side view of FIG. 17 is taken looking toward the right side of the example assembly 1600, in the orientation of FIG. 16. Similar to the examples shown and discussed above, a backer 1705 is attached to the fascia 105 and holds the PCB 1400, touch film 1500 and fascia 105 together in place. The backer 1705 may be constructed using any of the examples discussed above.

The example backer 1705 of FIG. 17 is constructed to form light cups, zones, areas, regions, etc. (one of which is designated at reference numeral 1710) that serve to reflect and contain light emitted by the LEDs 1410 and 1415. The light cups 1710 may be constructed to have reflective surfaces 1715. It should be understood that any of the examples shown and discussed herein may implement light cups. Moreover, an HMI assembly may include any number and/or shape(s) of light cups arranged in any way.

Figure 18:
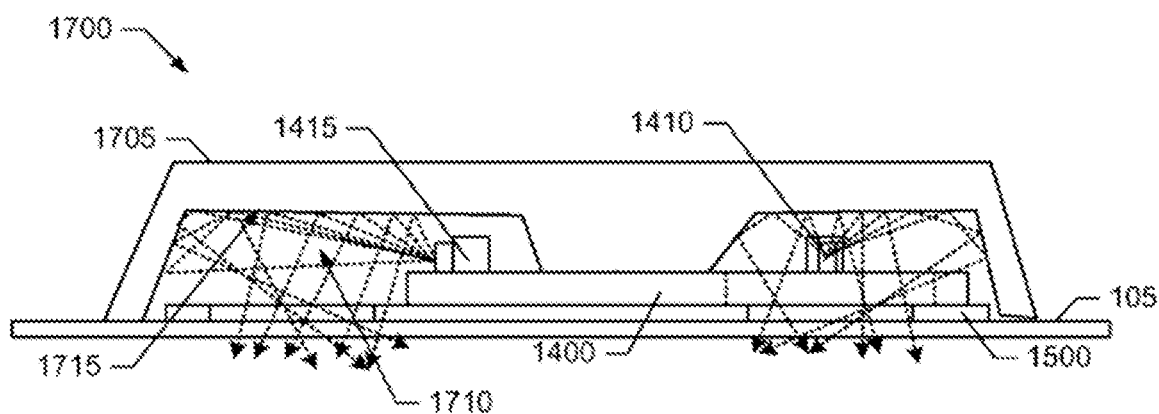
FIG. 18 is a side view of the example HMI assembly of FIG. 17 in a state with light emitting diodes (LEDs) emitting light.

FIG. 18 illustrates an example state of the HMI assembly 1700 in which the LEDs 1410 and 1415 are emitting light. As shown in FIG. 18, the light cups 1710 and surfaces 1715 serve to direct the light emitted by the LEDs 1410 and 1415 through the touch cells 1505 and 1510 and out through the fascia 105.

Figure 19:
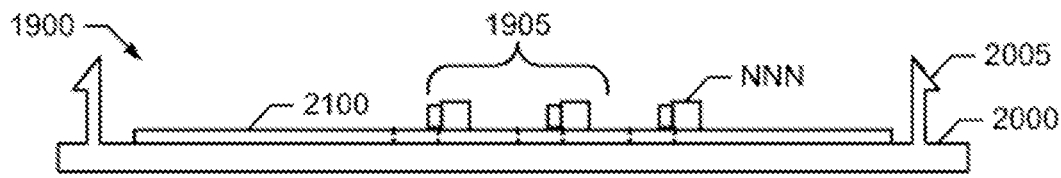
FIG. 19 is a side view of an example fascia and PCB assembly constructed in accordance with the teachings of this disclosure.
Figure 20:
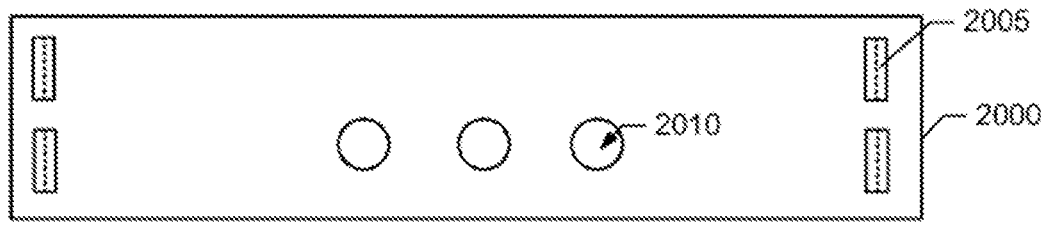
FIG. 20 is a top view of an example fascia that may be used to construct the example assembly of FIG. 19.
Figure 21:
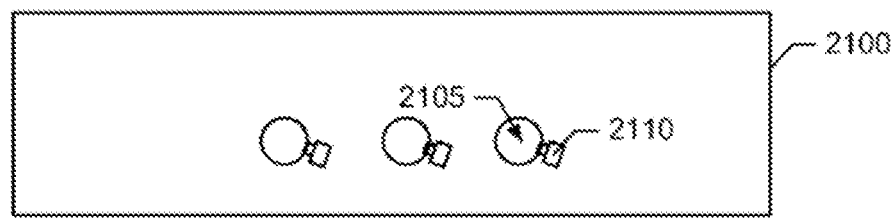
FIG. 21 is a top view of an example PCB that may be used to construct the example assembly of FIG. 19.

FIG. 19 is a side view of an example assembly 1900 constructed in accordance with the teachings of this disclosure using an example fascia 2000 shown in FIG. 20 and an example PCB 2100 shown in FIG. 21. FIG. 20 is a top view of the example fascia 2000, and FIG. 21 is a top view of the example PCB 2100.

As will be discussed below in more detail, the example fascia 2000 includes any number and/or type(s) of features (one of which is designated at reference numeral 2005) that allow a backer to be affixed to the fascia 2000. The example feature 2005 is a cantilevered hook. Other example features include, but are not limited to, a post and dome, a bayonet and finger, etc. In other examples, instead of a snap feature, a feature such as a post may be used that allows a backer to be screwed down in place. In more examples, the feature is constructed to allow, for example, a latch on the fascia 2000 or a backer to hold the backer down in place.

Figure 23:
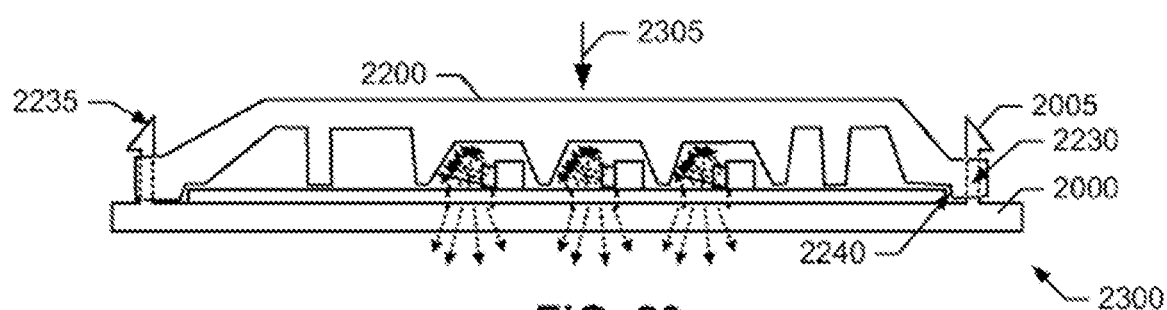
FIG. 23 is a side view of an example HMI assembly constructed in accordance with the teachings of this disclosure using the example assembly of FIG. 19 and the example flexible backer of FIG. 22.

To illuminate decorative areas of the fascia 2000 (one of which is designated at reference numeral 2010), the example PCB 2100 has corresponding openings 2105 defined therethrough and corresponding LEDs 2110. As shown in FIGS. 19 and 23, the fascia 2000 and PCB 2100 are assembled by placing the PCB 2100 on top of the fascia 2000, in the orientation of FIGS. 19 and 23.

Figure 22:
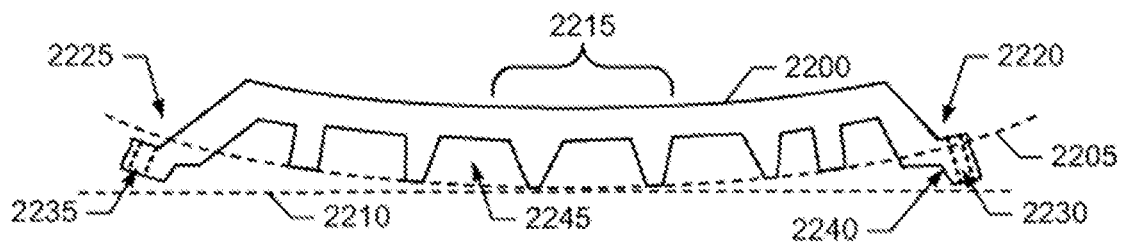
FIG. 22 is a side view of an example flexible backer constructed in accordance with the teachings of this disclosure.

FIG. 22 is a side view of an example flexible backer 2200 that may be attached to the fascia 2000 to hold the PCB 2100 in place against the fascia 2000. The flexible backer 2200 is a selectively flexible, meaning it can be flexed between and/or reversibly flexed between different shapes or states. An example flexible backer 2220 comprises an elastic material. Thus, as shown in FIGS. 22 and 23, the backer 2200 can be moved between a curved state or shape 2205, and a generally flat or planar state or shape 2210. In the examples disclosed herein, the curved state or shape 2205 is a relaxed or free of tension state, and the flat or planar state or shape 2210 is a flexed or loaded state. As used herein, curved and flat when referring to a backer refers to the overall shape of the backer, ignoring, for example, any features such as a light cup, stiff member, flexible members, etc. that maybe defined in or be a part of a backer. One of ordinary skill in the art will instantly recognize the meaning and differentiation between a curved state or shape of a backer, and a flat or planar state of shape of a backer.

With reference to FIG. 23, the backer 2200 may be assembled to the PCB 2100 and fascia 2000 by placing a middle portion 2215 of the backer 2200 against a middle portion 1905 of the PCB 2100 and fascia 2000 assembly 1900 of FIG. 19. Of course, the backer 2200, PCB 2100 and fascia 2000 may have other alignment(s) and/or orientation (s). The ends of the backer 2200 are moved, pushed or forced toward the fascia 2000 by applying a downward force (in the orientation of FIGS. 22 and 23) to the ends 2220 and 2225 of the backer 2200. As the ends 2220 and 2225 of the backer 2200 approach the fascia 2000, openings 2230 and 2235 defined through the backer 2200 positively engage the lock features 2005, thus, locking the backer 2220 in place against the PCB 2100 and fascia 2000.

In other examples, screws passing through the backer 2200 at the ends 2220 and 2225 engage features such as posts defined on the fascia 2000 to hold the backer 2200 against the PCB 2100 and fascia 2000. It should be understood that any other means to attach the ends 2220 and 2225 to the fascia 2000 may be used.

As the backer 2200 is flexed from the curved state 2205 to the flat state 2210, a downward force 2305 (in the orientation of FIGS. 19-23) is created in the middle portion 2215 of the backer 2200. This downward force 2305 is transferred to the PCB 2100 by the backer 2200 and may be used to provide any of the benefits describe herein, and/or to construct any of the disclosed examples to provide a force to bias a PCB against a touch film shown and discussed in connection with at least FIGS. 1-10.

As best demonstrated in FIG. 23, the backer 2200 may have a shape, feature or contour 2240 that serves to position the PCB 2100 relative to the fascia 2000.

As shown, the backer 2220 may include light cups 2245 as discussed and shown above in connection with at least FIGS. 17 and 18 to direct light from the LEDs 2110 through the openings 2105 and the decorative elements 2010.

While omitted for clarity of illustration, the example HMI assembly 2300 may include a touch film, as discussed above in connection with other examples.

Figure 24:
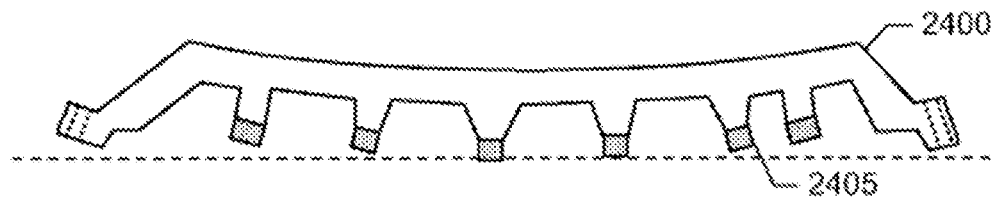
FIG. 24 is a side view of another example flexible backer that may be used to construct the example HMI assembly of FIG. 23.

Turning to FIG. 24, in some examples, a flexible backer 2400 includes one or more compressible portions 2405, such as a rubber, etc. tip or end. In some examples, the portions 2405 are constructed improve light block, to reduce rubbing or other undesired movements against a PCB, which may damage the PCB during some uses, and/or any alternative and/or additional purpose.

Figure 25A:
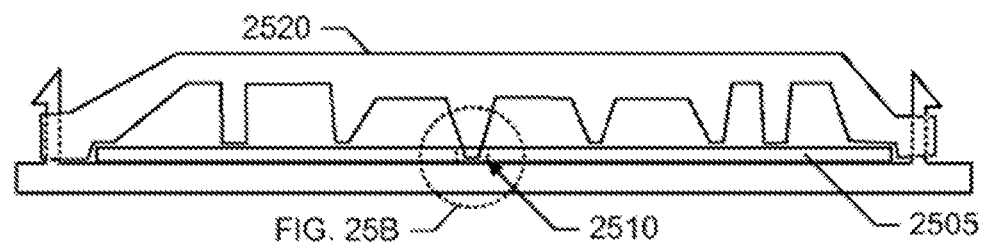
FIG. 25A is a side view of an example feature of a PCB that may be used to align the example PCB and the example flexible backer of FIGS. 20-23.
Figure 25B:
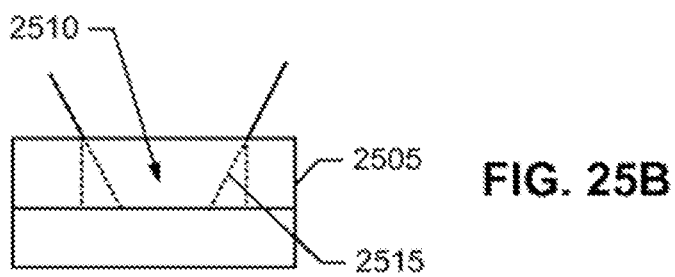
FIG. 25B illustrates an enlarged portion of FIG. 25A.

In FIG. 25A, a PCB 2505 has a hole 2510 defined at least partially through the PCB 2505 to receive a portion 2515 of a backer 2520. An enlarged view of the portion 215 and the hole 2510 is shown in FIG. 25B. The engagement of the hole 2510 and the portion 2515 serves to partially or wholly align the PCB 2505 with the backer 2520.

Figure 26:
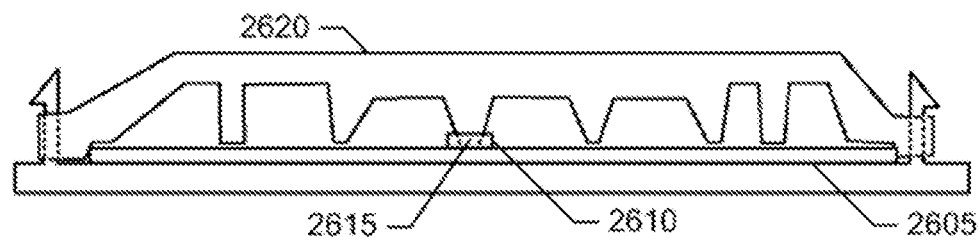
FIG. 26 is a side view of another example feature of a PCB that may be used to align the example PCB and the example flexible backer of FIGS. 20-23.

In FIG. 26, a PCB 2605 has a raised feature 2610 defined to receive a portion 2615 of a backer 2620. An example raised feature 2610 comprises a flat area surrounded at least partially by a wall or upward extending feature. The engagement of the feature 2610 and the portion 2615 serves to partially or wholly align the PCB 2605 with the backer 2620.

Figure 27:
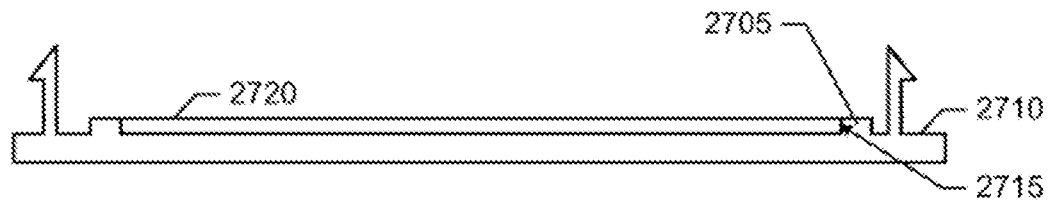
FIG. 27 is a side view of an example fascia having an example feature that may be used to align the example PCB and example backer of FIGS. 20-23.

In FIG. 27, a raised or extending feature 2705 of a fascia 2710 engages a boundary 2715 of a PCB 2720 to partially or wholly align the PCB 2720 with the fascia 2710. Example raised features include, but are not limited to a plastic post or rib.

In FIG. 28, a fascia 2805 has a feature 2810 defined partially or wholly in the fascia 2805 into which a PCB 2815 may be inset or received to partially or wholly align the PCB 2815 with the fascia 2805. An example feature 2810 is a rabbit joint or ledge around an area of the fascia 2805 into which the PCB 2815 is to be received.

Any of the example alignment constructions of FIGS. 23-28 may be used alone and/or in any combination(s).

Although certain example methods, apparatus and articles of manufacture have been described herein, the scope of coverage of this patent is not limited thereto. On the contrary, this patent covers all methods, apparatus and articles of manufacture fairly falling within the scope of the claims of this patent.

What is claimed is:

1. A human-machine interface assembly, comprising:
   a fascia;
   a touch film having a first raised contact;
   a printed circuit board (PCB) having a second raised contact; and
   a piercing member passing through the first and second contacts to electrically couple the first and second contacts.

2. The human-machine interface assembly of claim 1, wherein the piercing member mechanically couples the PCB to the fascia.

3. A human-machine interface assembly, comprising:
   a fascia;
   a touch film having a first raised contact;
   a printed circuit board (PCB) having a second raised contact; and
   a piercing member passing through the first and second contacts to electrically couple the first and second contacts;
   wherein the piercing member mechanically couples the PCB to the fascia; and
   wherein the piercing member is soldered to the PCB and is inserted into the fascia to form opposing forces between the PCB and the fascia.

4. The human-machine interface assembly of claim 1, wherein the piercing member is soldered to the PCB, and wherein the piercing member is a through-hole or surface-mount component.

5. The human-machine interface assembly of claim 1, further comprising a single-row header, the piercing member comprising a pin of the header.

6. The human-machine interface assembly of claim 1, wherein the PCB further comprises a light emitting diode (LED).

7. The human-machine interface assembly of claim 6, wherein the PCB further comprises a heatstake passing through the PCB.

8. The human-machine interface assembly of claim 7, wherein the LED is configured to emit light into the heatstake, and the heatstake is configured to emit the light through the fascia.

9. The human-machine interface assembly of claim 8, wherein the touch film comprises a touch cell and the light illuminates an area of the fascia corresponding to the touch cell.

10. The human-machine interface assembly of claim 9, wherein the heatstake passes through the touch cell.

11. The human-machine interface assembly of claim 9, wherein the area corresponds to at least a center of the touch cell.

12. The human-machine interface assembly of claim 9, wherein the heatstake is at least partially translucent or transparent.

13. The human-machine interface assembly of claim 9, wherein the heatstake comprises a planar wall portion or single-axis concave shape.

14. The human-machine interface assembly of claim 1, further comprising:
   a backer having an extension member, the extension member formed to press the first contact against the second contact by applying a force to the PCB at substantially the second raised contact.

15. The human-machine interface assembly of claim 14, wherein the member is a stiff member.

16. The human-machine interface assembly of claim 14, wherein the member is at least partially flexible, and comprises an angled finger shape, a z-shape, or an accordion shape.

17. The human-machine interface assembly of claim 14, wherein the member includes a compressible portion.

18. The human-machine interface assembly of claim 14, wherein the backer is selectively flexible between a first curved state and a second flexed state, the backer attached to the fascia by flexing the backer from the first state to the second state, and the member being disposed to apply the force to the PCB when the backer is attached to the fascia in the second state.

19. The human-machine interface assembly of claim 14, wherein the second flexed state is generally parallel to the fascia.

20. The human-machine interface assembly of claim 19, wherein the backer is attached to the fascia by a snap fitting or a screw while the backer is held in the second flexed state.

\* \* \* \* \*